US008150074B1

(12) United States Patent
Feldstein et al.

(10) Patent No.: US 8,150,074 B1
(45) Date of Patent: Apr. 3, 2012

(54) IMPEDANCE MATCHING SPEAKER WIRE SYSTEM

(75) Inventors: George Feldstein, Cresskill, NJ (US); Krunoslav Esteban Draganovic, Upper Nyack, NY (US)

(73) Assignee: Crestron Electronics Inc., Rockleigh, NJ (US)

( * ) Notice: Subject to any disclaimer, the term of this patent is extended or adjusted under 35 U.S.C. 154(b) by 908 days.

(21) Appl. No.: 12/221,971

(22) Filed: Aug. 8, 2008

(51) Int. Cl.
*H03H 7/38* (2006.01)

(52) U.S. Cl. .......................... 381/120; 333/32; 333/17.3

(58) Field of Classification Search .................. 381/120; 333/32, 17.3
See application file for complete search history.

(56) References Cited

U.S. PATENT DOCUMENTS

| | | | | | |
|---|---|---|---|---|---|
| 5,057,783 | A | * | 10/1991 | Gubisch | 324/710 |
| 5,298,682 | A | | 3/1994 | Salz | |
| 5,393,933 | A | | 2/1995 | Goertz et al. | |
| 5,459,440 | A | * | 10/1995 | Claridge et al. | 333/17.3 |
| 5,532,649 | A | | 7/1996 | Sahyoun | |
| 5,771,262 | A | * | 6/1998 | Benayoun et al. | 375/257 |
| 6,198,817 | B1 | * | 3/2001 | Derby et al. | 379/394 |
| 6,275,078 | B1 | * | 8/2001 | Zabroda | 327/108 |
| 6,414,562 | B1 | * | 7/2002 | Bouisse et al. | 333/32 |

OTHER PUBLICATIONS

Pavincich, "Characteristic Impedance of Cables at High and Low Frequencie", <http://home.mira.net/~marcop/ciocahalf.htm>, (1998).

"Class D Audio Amplifiers Save Battery Life", Maxim Application Note 1760, <http://pdfserv.maxim-ic.com/en/an/AN1760.pdf>, (2002).

* cited by examiner

*Primary Examiner* — Steven J Fulk
(74) *Attorney, Agent, or Firm* — Crestron Electronics Inc.

(57) ABSTRACT

An impedance matched connection is provided between a load and a power source that outputs signals within a predetermined frequency range. A coaxial line has a predetermined characteristic impedance and an inner conductor, an outer conductor, and an insulator the two conductors. Each conductor has a first end electrically connectable to output terminals of the power source. A compensation circuit has an adjustable impedance, a first terminal electrically connected to a second end of the inner conductor and to a first terminal of the load, and a second terminal electrically connected to a second end of the outer conductor and to a second terminal of the load. The compensation circuit is sufficiently adjustable to attain, for a pulse having a rise time/fall time faster than those associated with the predetermined range of frequencies, a combined impedance and load that is substantially equal to the characteristic impedance of the coaxial line.

31 Claims, 10 Drawing Sheets

IMPEDANCE MATCHING SPEAKER WIRE SYSTEM

BACKGROUND OF THE INVENTION

The present invention is directed to cabling and transmission lines and, in particular, to a coaxial cable arrangement and a compensation circuit for matching impedances, such as for a speaker wire system used for audio applications.

When a source of power, such as an audio signal source, etc., feeds a resistive load, the maximum available power is delivered to the load when the impedance of the load matches the impedance of the source. If the impedance of the load is greater than the impedance of the source, the load may be underutilized. Alternatively, if the impedance of the load is sufficiently less than the impedance of the source, the current draw by the load increases and may cause the power supply to fail. Moreover, if the impedance of the load does not match the impedance of the source, some of the power generated by the source is not transferred to the load but is instead reflected back towards the source.

As an example, an audio signal source, such as an audio amplifier, may be connected to a speaker over a coaxial cable or other speaker cable. Preferably, the combined impedance of the speaker and the speaker cable is matched to the impedance of the amplifier to prevent signal reflections.

SUMMARY OF THE INVENTION

According to an aspect of the invention, an apparatus provides an impedance matched connection between a power source and a load, the power source being operable to output signals having frequencies that are within a predetermined range. A coaxial line has a predetermined characteristic impedance and includes an inner conductor disposed about an axis of the coaxial line, an outer conductor disposed about the inner conductor, and an insulator disposed between the inner and outer conductors. The inner and outer conductors each have a first end that is electrically connectable to output terminals of the power source. A compensation circuit has an adjustable impedance and has a first terminal that is electrically connected to a second end of the inner conductor of the coaxial line and to a first terminal of the load, and has a second terminal that is electrically connected to a second end of the outer conductor of the coaxial line and to a second terminal of the load. The compensation circuit is sufficiently adjustable to attain, for a pulse having a rise time or a fall time associated with a further range of frequencies that is faster than those associated with the predetermined range of frequencies, a combined impedance of the compensation circuit and the load that is substantially equal to the characteristic impedance of the coaxial line.

In accordance with this aspect of the invention, the power source may be a class D audio amplifier that outputs audio signals, the predetermined range may be a range of frequencies from 20 Hz to 20 kHz, and the load may be a speaker. The outputted audio signals may be formed by low-pass filtering a modulated signal comprised of a train of pulses having corresponding pulse widths, and each one of the pulse widths of the modulated signal may be based on an amplitude and a frequency of an input audio signal associated with its corresponding pulse. Each one of the train of pulses of the modulated signal may have the rise time or the fall time that is associated with the further range of frequencies and may be formed by comparing a switching signal and the input signal associated with that pulse.

The compensation circuit may be sufficiently adjustable to attain, at the switching signal frequency or at the further range of frequencies, the combined impedance of the compensation circuit and the load that is substantially equal to the characteristic impedance of the coaxial line. A frequency of the switching signal may be at least tenfold greater than a maximum one of the predetermined range of frequencies of the output audio signals. The further range of frequencies may be at least forty-fold greater than the frequency of the switching signal.

The coaxial line may include a flexible core and an outer sheath, the inner conductor may be a first braided conductor that is disposed around the flexible core, the insulator may be disposed around the first braided connector, the outer conductor may be a second braided conductor that is disposed around the insulator, and the outer sheath may be disposed around the second braided conductor. One or more of the first and second braided conductors may be formed of oxygen free copper. The outer sheath may be formed of a low friction coefficient material. One or more of the first and second ends of the coaxial line may include a compression ferrule connection.

The predetermined characteristic impedance of the coaxial line may be defined by the relation $$Z_0 = \frac{377}{2\pi\sqrt{\varepsilon_{eff}}}\ln\left(\frac{D}{d}\right),$$

where $Z_0$ is the characteristic impedance of the coaxial line, D is the inner diameter of the outer conductor, d is the outer diameter of the inner conductor, and $\in_{eff}$ is the effective dielectric constant of the insulator.

The compensation circuit may include a capacitance connected in series with a variable resistance. The variable resistance may include a plurality of discrete resistances that are selectable using an octal switch.

A test device may be electrically connected to a first end of a coaxial line in place of the power source and may have an input/output terminal that is electrically connected to one of the inner and outer conductors of the coaxial line and a ground terminal that is electrically connected to another of the inner and outer conductors of the coaxial line. The test device may be operable to output a signal along the one of the inner and outer conductors of the coaxial line and to detect whether at least part of the signal is reflected back to the test device along the one of the inner and outer conductors. Absence of the reflected signal indicates that the combined impedance of the compensation circuit and the load is substantially equal to the characteristic impedance of the coaxial line.

The test device may be operable to determine whether the second end of the one of the inner and outer conductors has an open termination or is shorted. The test device may include an indicator circuit operable to indicate whether the combined impedance of the compensation switch and the load is substantially equal to the impedance of the coaxial line. The indicator circuit may include a light emitting diode (LED) display operable to change color or a bar graph display operable to indicate whether or not the combined impedance of the compensation circuit in the load is substantially equal to the impedance of the coaxial line.

Also in accordance with the invention, a system includes a power source, a load, and an apparatus for providing an impedance matched connection between the power source and the load in accordance with the above aspect of the invention. The power source may include an audio amplifier, and the load may include at least one device selected from the group consisting of a speaker and a recorder. The power source may include an audio transducer selected from the group consisting of a microphone and a tape head, and the load may include a speaker. Alternatively, or additionally, the load may include a recorder.

The power source may include a video signal source selected from the group consisting of a camera, a digital versatile disk (DVD) player, and a video cassette recorder (VCR), and the load may include at least one device selected from the group consisting of a display and a VCR. The power source may include a radio frequency (rf) signal source, and the load may include an rf antenna.

Another aspect of the invention is an audio system. A class D audio amplifier is operable to output audio signals are within a range of frequencies from 20 Hz to 20 kHz. The output audio signals are formed by low-pass filtering a modulated signal comprised of a train of pulses having corresponding pulse widths. Each one of the pulse widths is based on an amplitude and frequency of an input signal associated with its corresponding pulse. Each one of the train of pulses has a rise time or a fall time that is faster than those associated with a further range of frequencies and are formed by comparing a switching signal and the input signal associated with that pulse. A frequency of the switching signal is at least tenfold greater than a maximum one of the range of frequencies of the output audio signals, and the further range of frequencies is at least forty-fold greater than the frequency of the switching signal. A load has an impedance of about 8Ω. An apparatus provides an impedance matched connection between the class D audio amplifier and the load. A coaxial line has a predetermined characteristic impedance and includes an inner conductor disposed about an axis of the coaxial line, an outer conductor disposed about the inner conductor, and an insulator disposed between the inner conductor and the outer conductor. The inner and outer conductors each have a first end electrically that is connectable to output terminals of the power source. A compensation circuit has an adjustable impedance and has a first terminal that is electrically connected to a second end of the inner conductor of the coaxial line and to a first terminal of the load and has a second terminal that is electrically connected to a second end of the outer conductor of the coaxial line and to a second terminal of the load. The compensation circuit is sufficiently adjustable to attain, at the switching signal frequency or at the further range of frequencies, a combined impedance of the compensation circuit and the load that is substantially equal to the characteristic impedance of the coaxial line.

A further aspect of the invention is a method of providing an impedance matched connection between a power source and a load, the power source being operable to output signals having frequencies that are within a predetermined range. A coaxial line is provided that has a predetermined characteristic impedance and which includes an inner conductor disposed about an axis of the coaxial line, an outer conductor disposed about the inner conductor, and an insulator disposed between the inner conductor and the outer conductor. A first end of one of the inner and outer conductors of the coaxial line is electrically connected to an input/output terminal of a test circuit, and a first end of another of the inner and outer conductors of the coaxial line is electrically connected to a ground terminal. A compensation circuit is provided having an adjustable impedance. A first terminal of the compensation circuit is electrically connected to a second end of the inner conductor of the coaxial line and to a first terminal of the load, and a second terminal of the compensation circuit is electrically connected to a second end of the outer conductor of the coaxial line and to a second terminal of the load. A signal is outputted from the test device along the one of the inner and outer conductors of the coaxial line, the signal being a train of pulses each having a rise time or a fall time associated with a further range of frequencies that is faster than those associated with the predetermined range of frequencies, and whether at least part of the signal is reflected back to the test device along the one of the inner and outer conductors is detected. The presence of reflected signal indicates that the combined impedance of compensation circuit and the load is not equal to the characteristic impedance of the coaxial line. The adjustable impedance of the compensation circuit is adjusted until the reflected signal is no longer detected, whereby the combined impedance of the compensation circuit, and the load is substantially equal to the impedance of the coaxial line.

In accordance with this aspect of the invention, the power source may be a class D audio amplifier that outputs audio signals, the predetermined range may be a range of frequencies from 20 Hz to 20 kHz, and the load may be a speaker. The outputted audio signals may be formed by low-pass filtering a modulated signal comprised of a train of pulses having corresponding pulse widths, and each one of the pulse widths of the modulated signal may be based on an amplitude and a frequency of an input audio signal associated with its corresponding pulse. Each one of the train of pulses of the modulated signal may have the rise time or the fall time that is associated with the further range of frequencies and may be formed by comparing a switching signal and the input signal associated with that pulse.

The compensation circuit may be sufficiently adjustable to attain, at the switching signal frequency or at the further range of frequencies, the combined impedance of the compensation circuit and the load that is substantially equal to the characteristic impedance of the coaxial line. A frequency of the switching signal may be at least tenfold greater than a maximum one of the predetermined range of frequencies of the output audio signals. The further range of frequencies may be at least forty-fold greater than the frequency of the switching signal.

The detecting step may include determining whether the second end of the one of the inner and outer conductors of the coaxial line has an open termination or is shorted. An indicator circuit may be provided together with the test device and indicates whether the combined impedance is substantially equal to the impedance of the load. The indicator circuit may be disconnected after the adjusting step is carried out, and the first end of the inner and outer conductors of the coaxial line is connected to terminals of the power source.

The foregoing aspects, features and advantages of the present invention will be further appreciated when considered with reference to the following detailed description and accompanying drawings.

DETAILED DESCRIPTION

Figure 1:
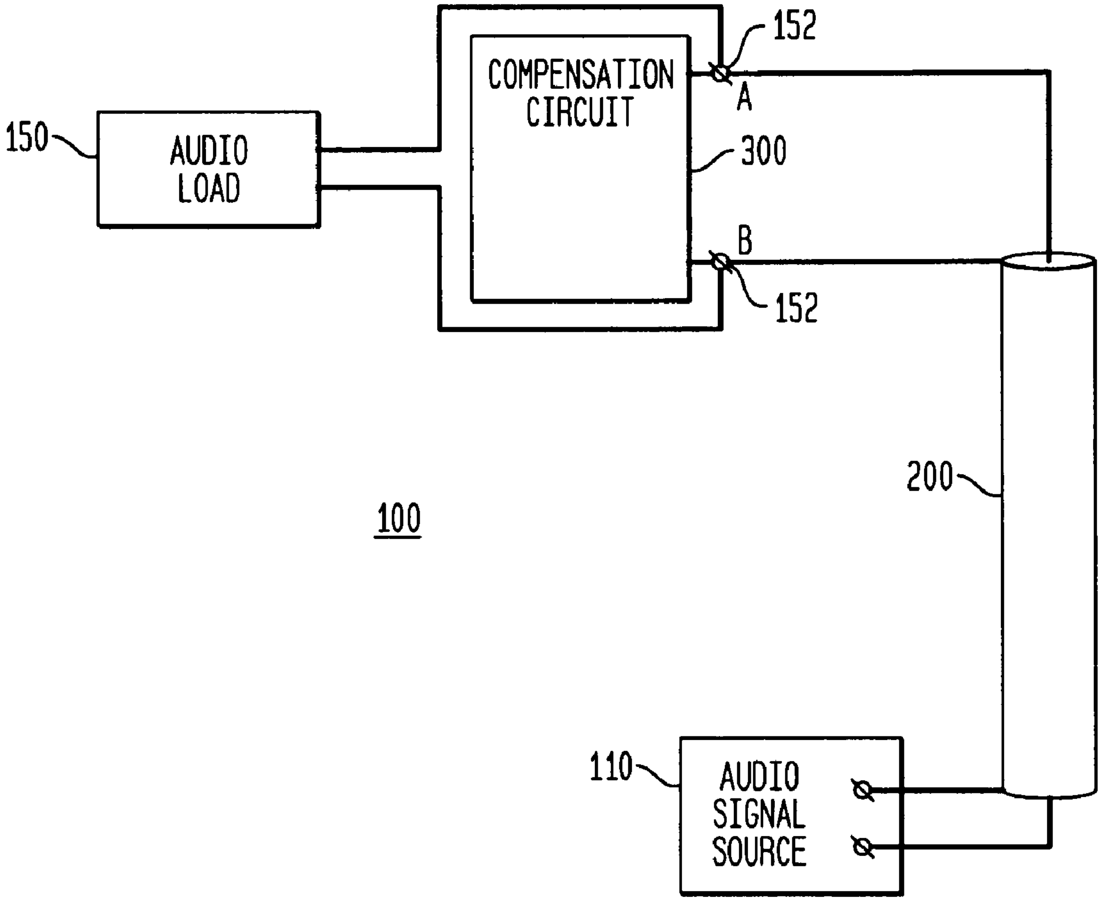
FIG. 1 is a schematic diagram illustrating a transmission system in accordance with an embodiment of the invention.

FIG. 1 schematically illustrates an audio transmission system 100 according to an embodiment of the invention. The audio transmission system 100 includes an audio signal source 110 which includes a class D audio amplifier and which delivers power to a speaker or other audio load 150. Alternatively, or additionally, the audio load may be a recorder. A coaxial line 200 is connected at one end to the output of the audio signal source 110 using, for example, compression ferrules (not shown). At the other end of the coaxial line, a compensation circuit 300 is connected, such as also using compression ferrules. The compensation circuit is connected across the input terminals 152 of the audio load 150.

Figure 2A:
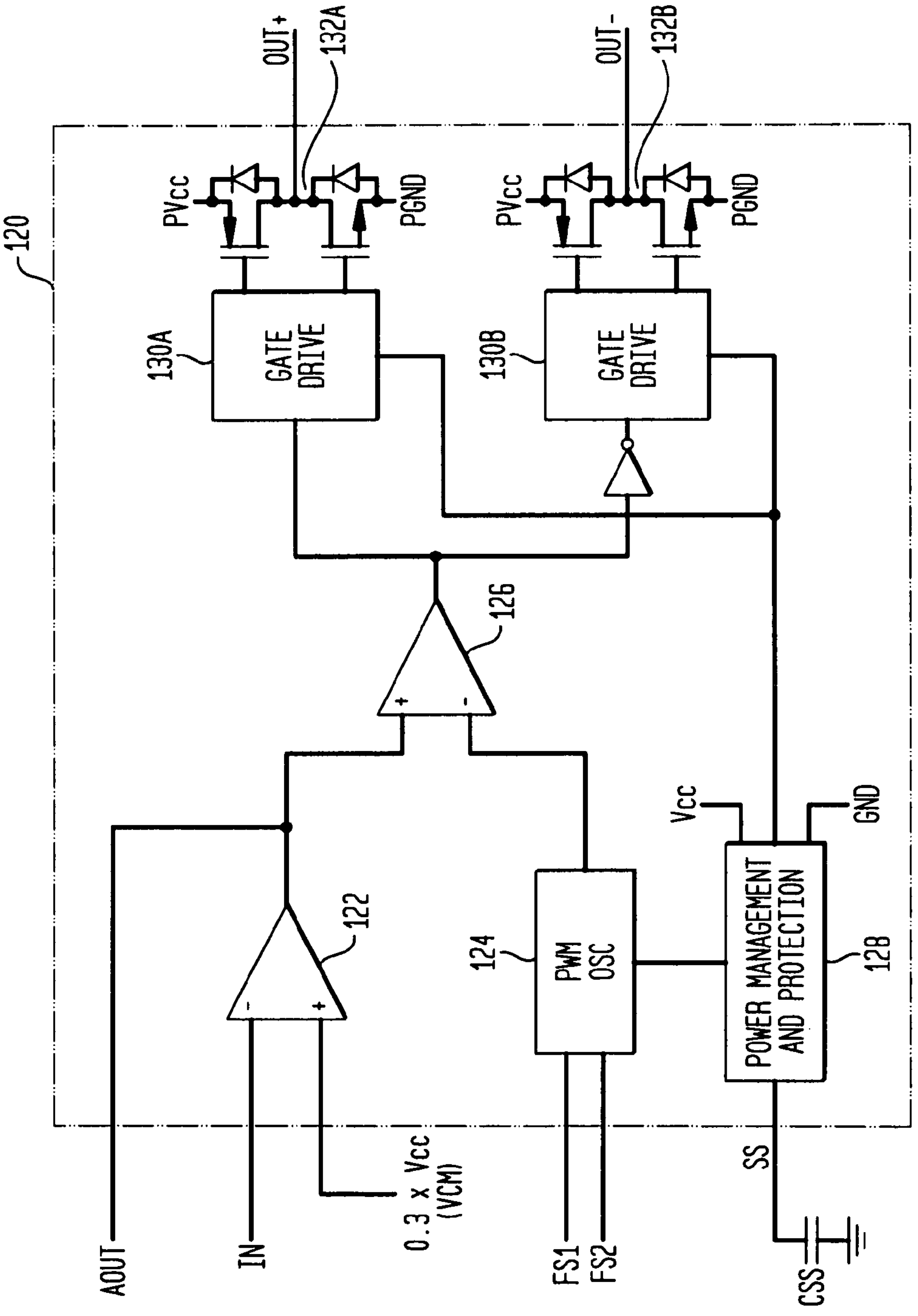
FIG. 2A is a schematic diagram illustrating an example of a class D audio amplifier.

FIG. 2A schematically illustrates an example of a class D audio amplifier 120. Such class D audio amplifiers are known in the art and may include, e.g., one or more input preamplifiers 122, a sawtooth wave oscillator 124, one or more comparators 126, one or more MOSFET drivers 130A and 130B, and one or more H-bridges 132A and 132B.

The input preamplifier 122 filters and level shifts an incoming audio signal and outputs the resulting audio signal to the comparator 126. The sawtooth wave oscillator 124 generates a sawtooth wave signal and delivers same to the comparator 126. The comparator 126 samples the audio signal by comparing the audio signal to the sawtooth wave. The oscillator frequency of the sawtooth wave oscillator 124 determines the duration of the sampling period. The comparator 126 then outputs a pulse-width modulated square wave that drives the H-bridge 132A, 132B. The H-bridge 132A, 132B then outputs the square wave differentially to an output filter (not shown) for delivery to the audio load.

Figure 2B:
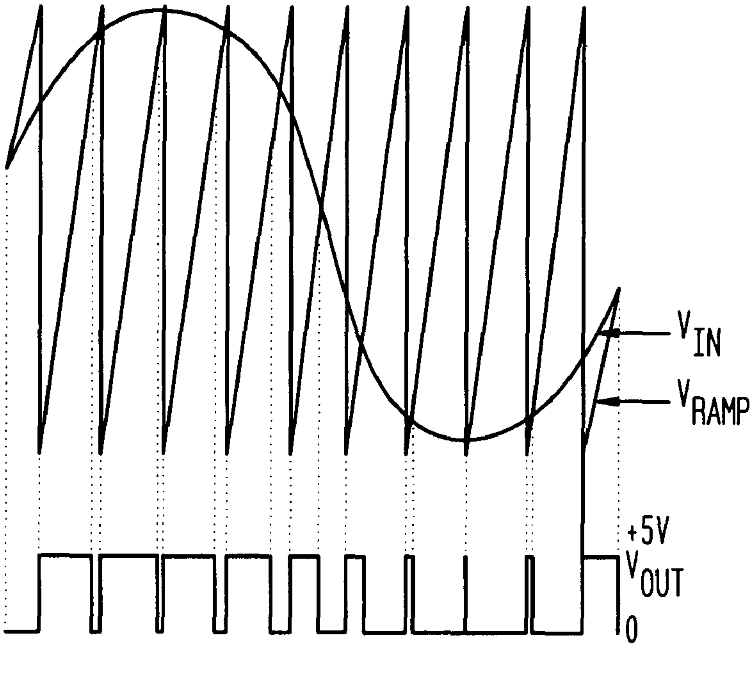
FIG. 2B is a diagram illustrating various signals used in the operation of the class D audio amplifier of FIG. 2A.

FIG. 2B illustrates an example of an audio signal $V_{IN}$ and a sawtooth wave $V_{RAMP}$ which are supplied to the comparator 126, and a resulting pulse-width modulated square wave $V_{OUT}$ outputted by the comparator. For clarity, the frequency of the sawtooth wave $V_{RAMP}$ shown is relatively close to the frequency of the audio signal $V_{IN}$. More typically, the frequency of the sawtooth wave $V_{RAMP}$ is much greater than the maximum frequency of the audio signal $V_{IN}$.

During a given switching period, the comparator output $V_{OUT}$ is low when the amplitude of the sawtooth wave $V_{RAMP}$ exceeds the amplitude of the input signal $V_{IN}$ and is high when the amplitude of the sawtooth wave $V_{RAMP}$ does not exceed the amplitude of the input signal $V_{IN}$. For a given input level of the audio signal $V_{IN}$, the comparator output $V_{OUT}$ is a duty-cycle modulated square wave having a period that is determined by the frequency of the sawtooth wave $V_{RAMP}$. If the amplitude of the audio signal $V_{IN}$ supplied to the comparator 126 exceeds the amplitude of the sawtooth wave $V_{RAMP}$, the resultant duty cycle is the same as if the magnitude of the audio signal $V_{IN}$ is equal to that of the sawtooth wave, resulting in the occurrence of clipping at the load. Hence, the dynamic range of the class D amplifier is determined by the noise floor and by the amplitude of the sawtooth wave.

The duty-cycle modulated square wave $V_{OUT}$ outputted by the comparator 126 controls the gate drivers 130A, 130B of the H-bridge 132A, 132B, thereby reversing the direction of the output current to the output filter within a single period. The output filter is typically a 2nd-order LC low-pass filter having a cutoff frequency that is set just above the desired system audio bandwidth. The low-pass filter removes high-frequency content from the H-bridge square wave output $V_{OUT}$ and allows an amplified audio signal to pass unchanged through the output filter.

Because low-pass filters have a finite rejection in their stop-band, a small amount of the switching frequency sawtooth wave signals typically bleed through to the load. Usually, this effect is of no consequence at the audio load because common audio transducers are incapable of reproducing such frequencies, and even if a speaker were capable of reproducing such high frequency signals, the reproduced audio signals could not be heard by a listener. However, such unwanted high frequency signal may be reflected back by the audio load to the audio signal source. Also, other filter nonlinearities are present within the own pass band of the low-pass filter and produce a small amount of total harmonic distortion (THD) and noise. Though the choice of filter used can reduce such aberrations below audible levels, they are not completely eliminated.

The present invention prevents the reflection of such high frequency signals by the audio load. The audio transmission system is impedance matched at much higher frequencies than those of the primary audio signals delivered by the audio transmission system to the audio load. As a result, any high frequency signals that bleed through the low-pass filter are absorbed by the audio load and are not reflected back to the audio signal source. Additionally, the frequencies associated with the rising and falling edges of the sawtooth wave, which are much higher than the switching frequency, are also absorbed by the audio load and not reflected back.

More specifically, the present invention provides an audio transmission system that is impedance matched at either the switching frequency or the frequencies associated with the rise and fall times. A transmission cable is configured to provide impedance matching at the typical audio frequencies, namely, from 20 Hz to 20 kHz. A compensation circuit is provided that enables impedance matching at these higher frequencies. Using the compensation circuit, impedance matching is carried out at the frequency of the sawtooth wave, which is typically 250 kHz, and/or at the frequencies associated with the rising or falling edges of the individual pulses, which is typically about 10 MHz.

The impedance matching of the audio transmission system 100 is attained when the combined impedance of the compensation circuit 300 and the audio load 150 is substantially equal to the impedance of the coaxial line 200. For example, the coaxial line 200 may be configured to have a characteristic impedance that is close to that of the audio load 150. The compensation circuit 300, which is adjustable to provide a plurality of different impedances, may be adjusted to select an impedance therein that attains the desired combined impedance.

Figure 3A:
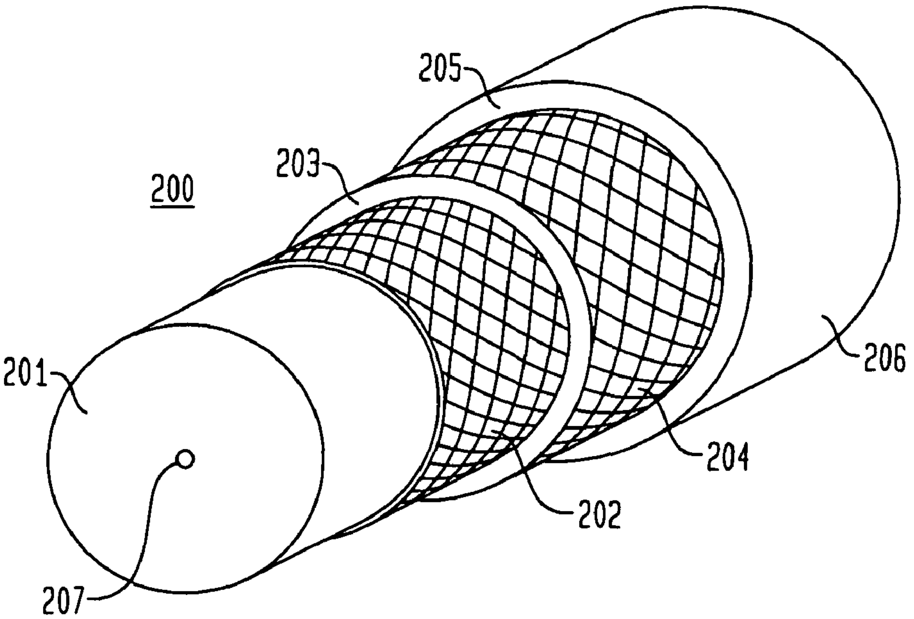
FIG. 3A is a segmented, cut-away view of a coaxial cable in accordance with an embodiment of the invention.

FIG. 3A depicts a cut-away view of an example of the coaxial cable 200 shown in FIG. 1. At the center of the coaxial cable 200, a core filament 207 is provided and is surrounded by a flexible layer 201. Preferably, the core filament 207 is formed of Kevlar, and the flexible layer is a plastic or an elastomer. An inner conductor 202 is formed around the flexible layer 201 and is typically a braided copper conductor that is preferably formed of oxygen-free copper. An insulating layer 203 surrounds the inner conductor 202 and provides electrical insulation between the inner conductor 202 and an outer conductor 204 that is located around the insulating layer 203. The outer conductor 204 is also typically a copper braided conductive layer that is preferably formed of oxygen-free copper. A flexible protective cover 205 and an outer sheath 206 are provided and surround the outer conductor 204. Preferably, the outer sheath 206 is formed of a material having a low friction coefficient to facilitate, for example, the pulling of the coaxial cable 200 through a conduit.

Figure 3B:
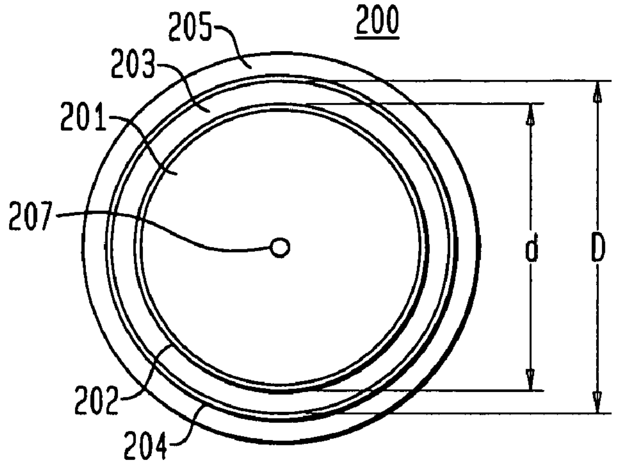
FIG. 3B is a cross-sectional view of the coaxial cable shown in FIG. 3A.

FIG. 3B is a cross-sectional view of the coaxial cable 200 in which the insulating layer 203 is defined as having an inner diameter d and an outer diameter D. The characteristic impedance $Z_0$ of the coaxial cable 200 is thus defined by the relation:

$$Z_0 = \frac{377}{2\pi\sqrt{\varepsilon_{eff}}}\ln\left(\frac{D}{d}\right),$$

where $\in_{eff}$ is the effective dielectric constant of the insulator, and the relation is defined for a cable having a circular cross-sectional geometry. If the cable has a different geometry, the "2π" in the denominator is replaced with another value. By selecting an appropriate material to serve as the insulating layer 203 and appropriate inner and outer diameters for the insulating layer 203, a desired characteristic impedance $Z_0$ of the coaxial cable 200 may be attained. Preferably, the resulting characteristic impedance is close enough to the impedance of the audio load 150 so that further correction may be carried out using the compensation circuit 130.

As an example, the coaxial cable 200 may have a characteristic impedance $Z_0$ of about 8 ohms. To attain such a characteristic impedance, the core 201 may have a diameter of 0.3 inches, the inner braided conductor 202 may have an outer diameter of 0.322 inches, namely the inner diameter of the insulating layer 203 is 0.322 inches. The outer diameter of the insulating a layer 203 may be 0.404 inches, resulting in the layer having a thickness of 41.7 mils. The outer braided conductor 204 may have an outer diameter of 0.432 inches, and the outer diameter of the entire cable may be 0.472 inches. The desired characteristic impedance $Z_0$=8 ohms is thus attained using a material having a dielectric constant of about 3 as the insulating layer 203.

Figure 4:
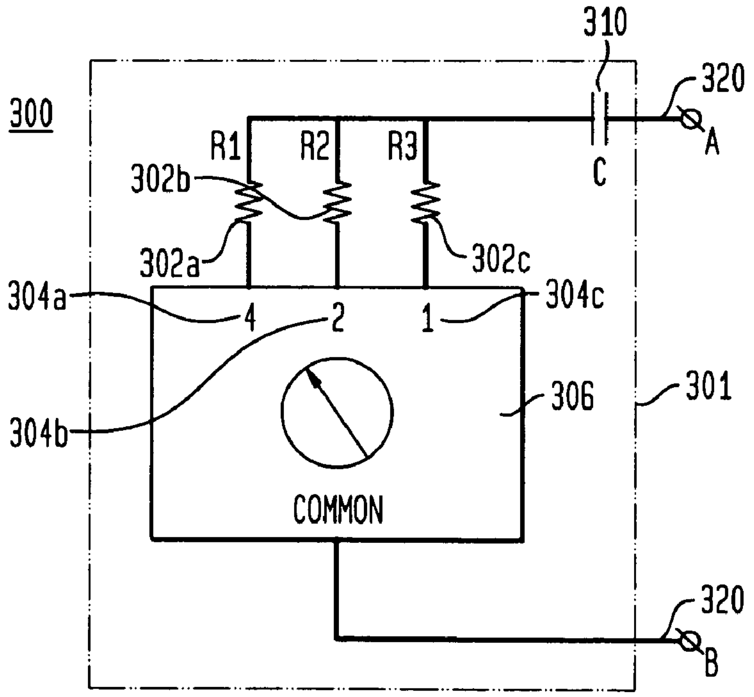
FIG. 4 illustrates a compensation circuit in accordance with another embodiment of the invention.

FIG. 4 shows an example of an embodiment of a compensation circuit 300 according to of the invention. The compensation circuit 300 is connected in parallel with the audio load 150 and provides an adjustable impedance across the terminals A and B by providing a variable resistance connected in series with a predetermined capacitance 310. For example, on a circuit board 301, an octal switch 306 may be provided that switches from among contacts 304*a*, 304*b*, and 304*c* to select from among resistor R1 302*a*, resistor R2 302*b*, or resistor R3 302*c* to be connected in series with the capacitance 310.

Figure 5:
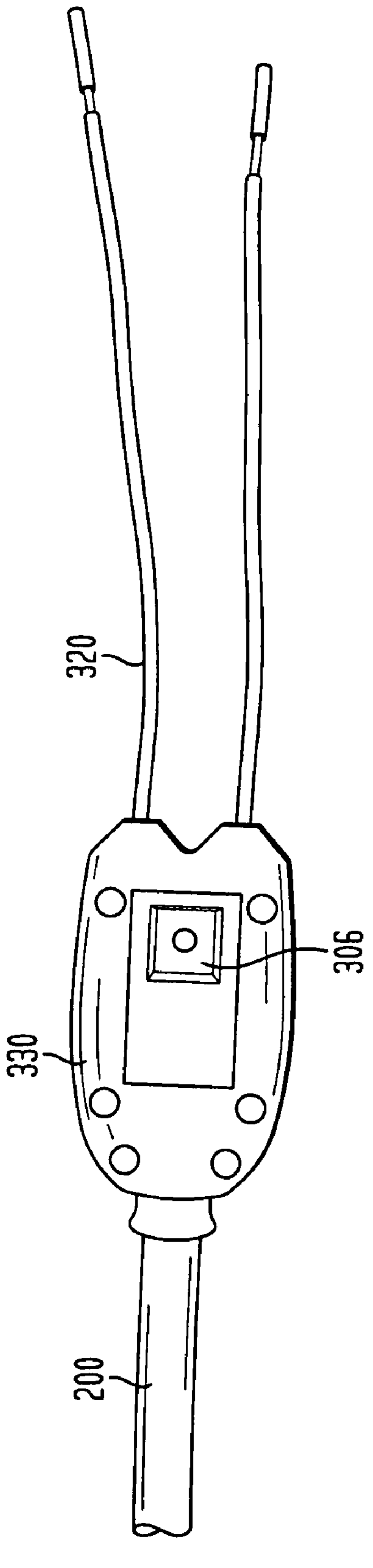
FIG. 5 is a perspective view of a speaker-side connection of a transmission line which incorporates the compensation circuit shown in FIG. 4.

FIG. 5 illustrates an example of the audio load side of the invention in which the coaxial cable 200 of FIGS. 3A and 3B is electrically connected to the compensation circuit 300 of FIG. 4 that is shown here disposed in a casing 330. The connection lines 320 of the compensation circuit are connectable to the input terminals of the audio load 150. The octal switch 306 or the like is located near an opening in the casing to enable its access.

Figure 6A:
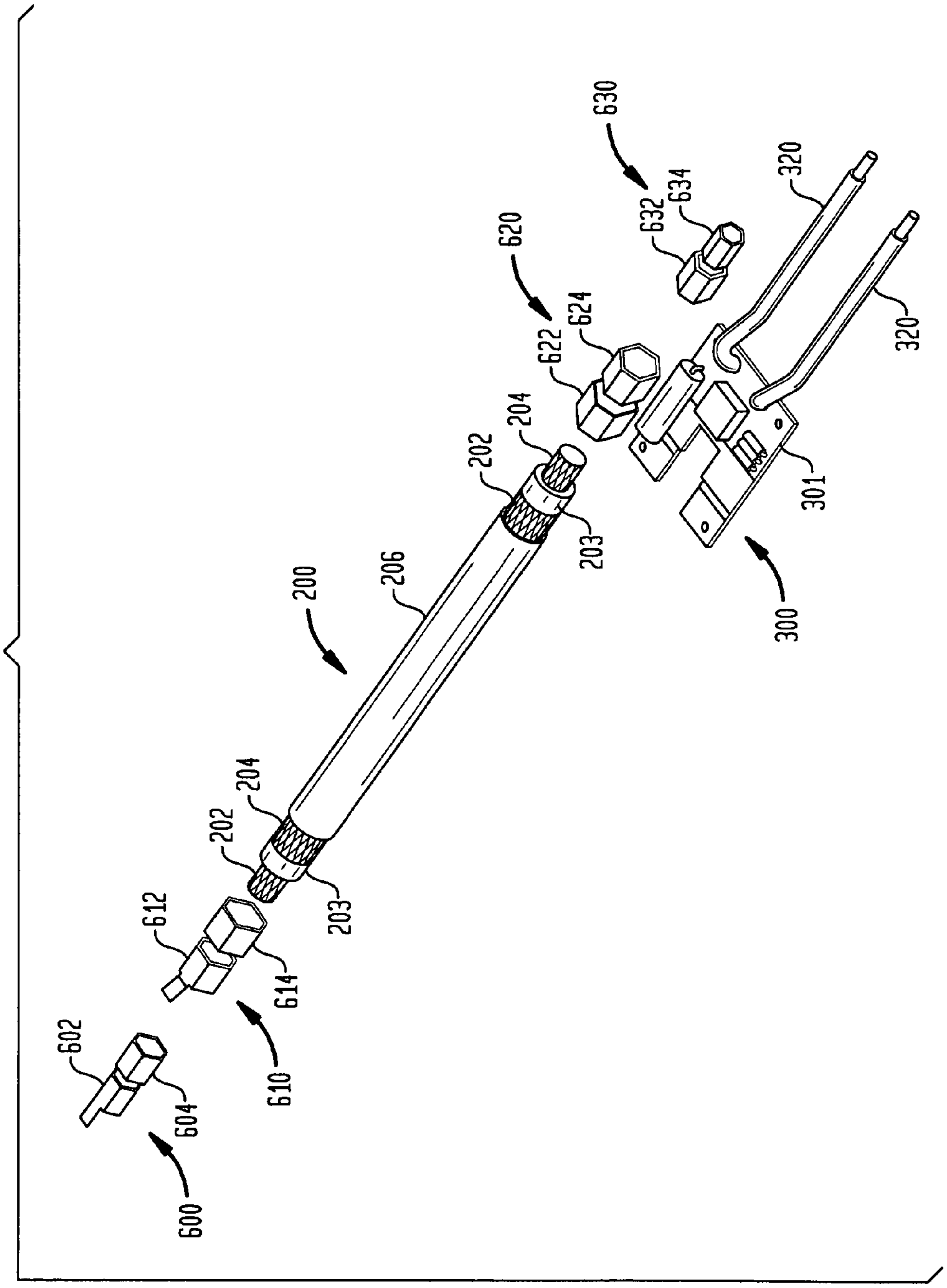
FIGS. 6A and 6B are exploded views of a further embodiment of the invention in which the coaxial cable shown in FIGS. 3A and 3B and the compensation circuit shown in FIGS. 4 and 5 are connected using ferrule interfaces.
Figure 6B:
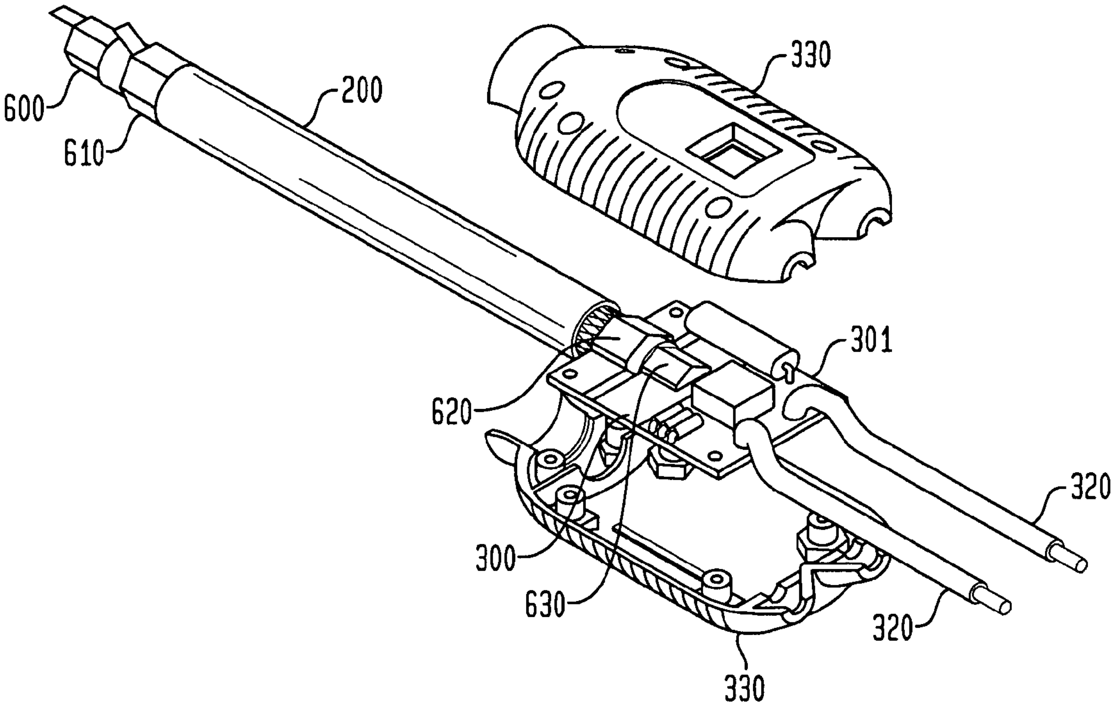
Figure 6C:
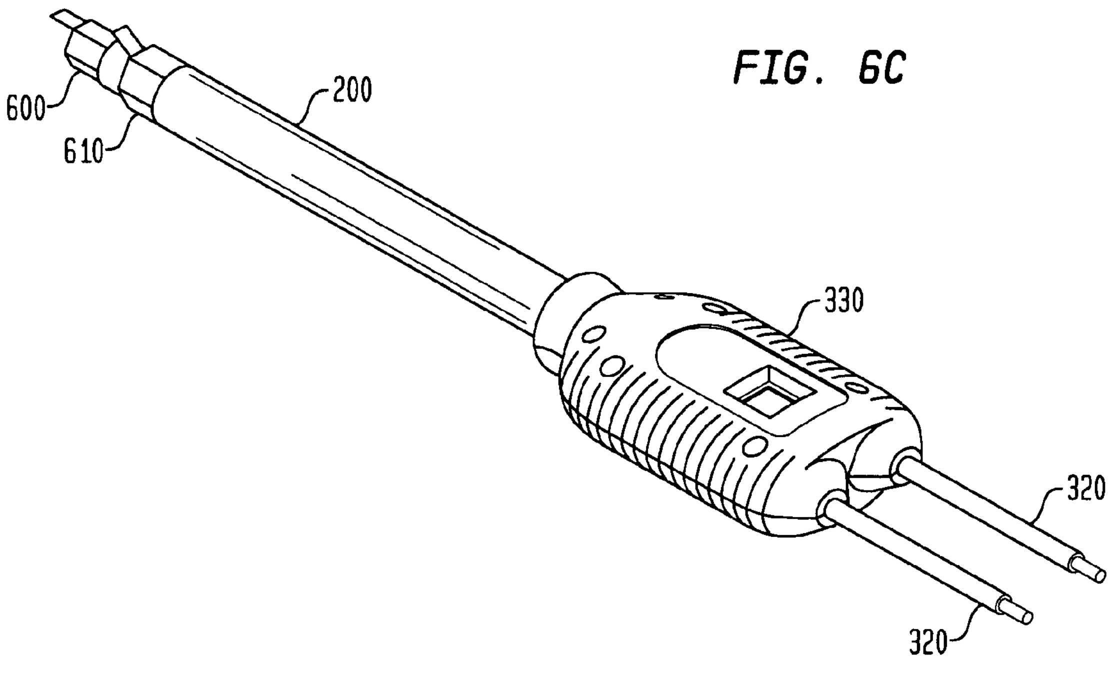
FIG. 6C is a perspective view of the embodiment of the invention shown in FIGS. 6A and 6B.

The casing 330 also encloses the end of the coaxial cable 200. FIGS. 6A-6C illustrates another embodiment of the invention in which compression ferrules and solderable ferrules are provided as transitions between the coaxial cable 200 and the compensation circuit 300 and as transitions between the coaxial cable 200 and the audio signal source 110.

FIG. 6A shows a first inner connector 600 that connects the inner conductor 202 of the coaxial cable 200 to a corresponding connector on the audio signal source (not shown). The first inner connector 600 includes a compression ferrule at one end that is crimp connected onto the inner conductor 202. At the other end of the first inner connector 600, a copper ferrule 602 that includes a solder tab is solder connected to a terminal on the audio signal source. Also, a first outer connector 610 includes a compression ferrule 614 which is crimp connected onto the outer conductor 204 of the coaxial cable 200. The first outer connector 610 also includes a copper ferrule 612 having a solder tab which is solder connected to another terminal on the audio signal source. FIG. 6B shows the coaxial cable 200 with the first inner connector 600 and the first outer connector 610 respectively crimp connected to the inner conductor 202 and outer conductor 204.

Referring again to FIG. 6A, a further inner connector 630 includes a compression ferrule 632 which is crimp connected onto the inner conductor 204 at the opposite end of the coaxial cable 200. A further outer connector 620 includes a compression ferrule 622 that is crimp connected onto the outer conductor 204 at the same end of the coaxial cable 200 to which the further inner connector 630 is connected. The further inner connector 630 also includes a solderable ferrule 634, and the further outer connector 620 includes a solderable ferrule 624. As FIG. 6B shows, the solderable ferrules 624 and 634 are a solder connected to respective locations on the circuit board 301 of the compensation circuit 300.

FIGS. 6A-6C illustrate only one possible configuration of the connectors 600, 610, 620, and 630 as well as only one possible configuration for each of their respective ferrules. Other configurations of the connectors and their ferrules are also possible and are within the scope of the present invention.

FIG. 6B also shows an exploded view of two sections of the casing 330. FIG. 6C shows the casing 330 with the two sections mated around the compensation circuit 300.

Figure 7A:
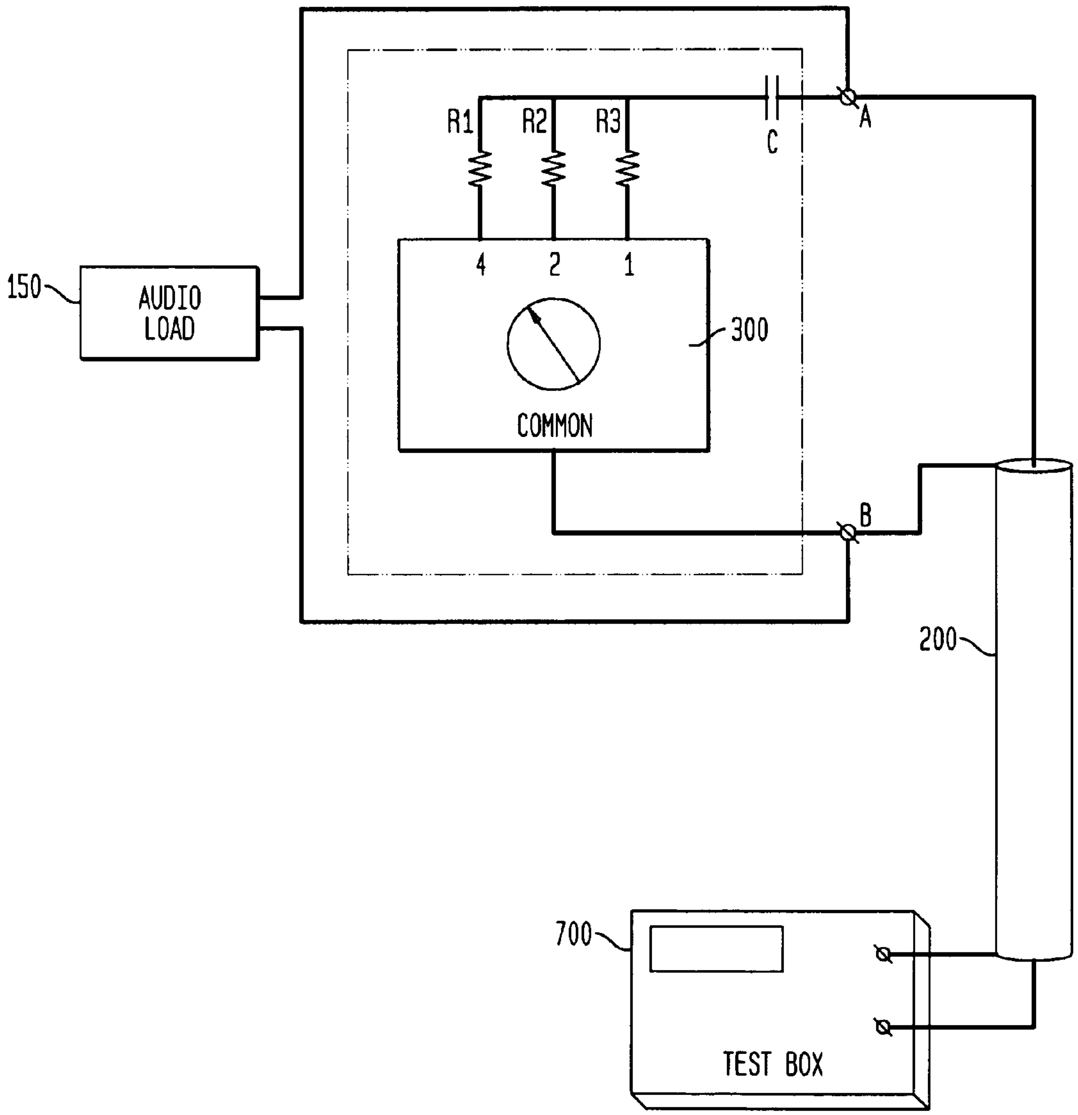
FIG. 7A is a diagram illustrating a still further embodiment of the invention in which a test box is used.
Figure 7B:
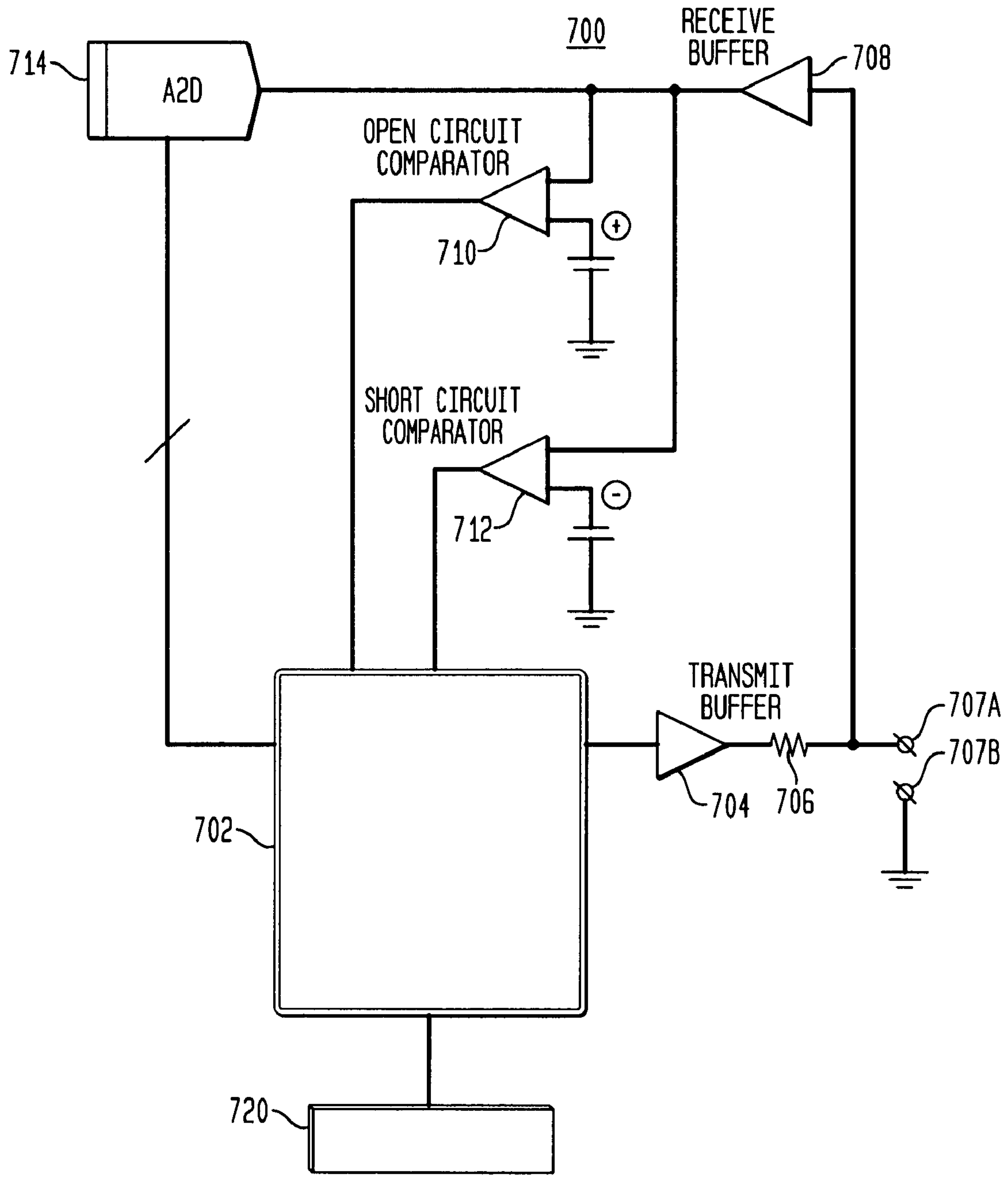
FIG. 7B is a block diagram illustrating in greater detail the test box shown in FIG. 7A.

FIGS. 7A-7B illustrate yet another embodiment of the invention in which impedance matching is carried out using a test box, also known as a set-up box. FIG. 7A shows the transmission system depicted in FIG. 1 but with a test box 700 connected to the coaxial line 200 in place of the audio signal source 110. The test box 700 generates a test signal that is transmitted over one of the conductors of the coaxial cable 200 and over the compensation circuit 300 to the audio load 150. If the combined impedance of the coaxial cable 200 and the compensation circuit 300 does not match that of the audio load 150, some of the power of the generated signal is reflected back to and detected by the test box. Alternatively, if the combined impedance of the coaxial cable and the compensation circuit substantially matches that of the audio load 150, no reflected power is detected by the test box 700.

FIG. 7B is a block diagram illustrating an example of the test box 700. A processor 702 generates a test signal formal of one or more pulses or voltage steps, and preferably a train or sequence of such pulses or steps, to a transmit buffer 704 which outputs the one or more pulses or steps across resistor 706 to a terminal 707A connected to one of the conductors of the coaxial cable 200. The pulses preferably provide a test signal at either the frequency of the sawtooth wave, i.e., the switching frequency, of the class D amplifier, which is about 250 kHz, or at the frequencies associated with the rising and falling edges of these signals, which are about 10 MHz. The other conductor of the coaxial cable 200 is connected to ground through terminal 707B. The resistance of the resistor 706 is preferably selected to provide an impedance which is substantially or nearly the same as the characteristic impedance of the coaxial cable 200 and which is substantially or nearly the same as that of the audio load 150. For example, in a typical audio transmission application where the audio load is a speaker, the audio load typically has a resistance of about 8 ohms and the characteristic impedance of the coaxial cable is also about 8 ohms so that a resistor having about an 8 ohm resistance is chosen as resistor 706.

The transmitted one or more pulses or steps are delivered along the coaxial cable 202 to the audio load 150. When the impedance of the audio load is substantially identical to that of the resistor 706, the entire transmitted pulse or step is absorbed by the audio load, and no signal is reflected back. When the resistance of the audio load differs from that of the resistor 706, the pulse is at least in part reflected back along the coaxial cable to the test box 700. The reflected signal is delivered through the terminal 707A to a receive buffer 708 which outputs the reflected signal to an analog-to-digital converter 714 which, in turn, converts the reflected signal and delivers the converted signal to the processor 702. At the processor 702, the impedance of the audio load is determined based on the ratio of the intensity of the reflected signal to the intensity of the originally outputted signal and based on the impedance of the resistor 706.

After determining the impedance of the audio load, the processor then controls the output of a display 720 accordingly. For example, when the display 720 includes one or more light emitting diodes (LEDs), the processor 702 may control the number of LEDs that are lit based on the difference between the detected impedance of the audio load and the impedance of the resistor 706, or the processor 702 may simply cause an LED of one color to be lit when the two impedances are not matched and another color LED to be lit when the two impedances are not matched. As another example, the display 720 may be a bar graph display that provides similar indications.

When no audio load is connected to the remote end of the coaxial line 200, the test box 700 is able to determine whether the remote end of the coaxial line is open or shorted. Ordinarily, when one or more pulses or steps are sent along a transmission line that is either open or shorted at its remote end, the transmitted signal is reflected back along the transmission line having essentially the same intensity as the transmitted signal so that the processor 702 of the test box 700 would not be able to distinguish whether the coaxial line is open or shorted solely from the output of the analog-to-digital converter 714. The test device 700 therefore includes an open circuit comparator 710 and a short circuit comparator 712. When the remote end of the coaxial line 710 is shorted, the reflected voltage drops abruptly to zero after the reflected pulse is received, and the abrupt drop in voltage is detected by the short circuit comparator 712 which delivers an associated indication to processor 702. Alternatively, when the remote end of the coaxial cable is open, the detected voltage abruptly increases to twice the voltage of the original pulse after the reflected pulse is received, and the increase is detected by the open circuit comparator 710 which, in turn, delivers a corresponding indication to the processor 702. The processor 702 may then control the display circuit 720 to provide an output accordingly.

Referring back to FIG. 7A, the adjustable compensation circuit 300 provides a selection of impedances to allow the combined impedance of the comparator 300 and the audio load 150 to match the characteristic impedance of the coaxial line 200. Thus, if the test box 700 determines and provides indication that the impedance of the audio load 150 does not match the characteristic impedance of the coaxial cable 200, the compensation circuit may be adjusted until the impedances are matched. Such a mismatch impedance may occur, for example, when either the actual impedance of the coaxial line and/or the actual impedance of the audio load is either greater than or less than its specified value. Alternatively, the impedances of the coaxial line and the audio load may be matched at lower operational frequencies but not matched at higher operational frequencies because the impedance of the audio load changes at such higher frequencies. The test box can be controlled to output a higher frequency train of pulses or steps to determine the mismatch of impedances at such higher frequencies, and then the compensation circuit may be adjusted to compensate for this mismatch. Once the compensation circuit is adjusted to compensate for the mismatch at the higher frequencies, the impedances of the audio load and the coaxial line remain essentially balanced at lower frequencies because of the frequency dependence of the contribution of the capacitor 310 to the impedance of the compensation circuit 300. At the lower frequencies, the contribution of the capacitor to the impedance is much greater than the contribution of the resistors so that any change in resistance has only a small effect on the impedance. By contrast, at the higher frequencies, the contribution by the capacitor decreases so that changes in resistance within the compensation circuit have a greater effect.

In operation, the test box 700 is controlled to generate one or more pulses or voltage steps, and the position of the octal switch, is then varied accordingly until substantially matching impedances are attained and are displayed by the LED display or bar graph display. The test box 700 is only connected to the coaxial cable 120 until the impedances are matched. Once the impedances are matched, the test box 700 is disconnected from the transmission line and replaced with the audio signal source 110, and the audio signal source is then operable to transmit signals to the audio load with no or minimal reflections.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus for providing an impedance matched connection between a power source and a load, the power source being operable to output signals having frequencies that are within a predetermined range, the apparatus comprising:

a coaxial line having a predetermined characteristic impedance and including an inner conductor disposed about an axis of the coaxial line, an outer conductor disposed about the inner conductor, and an insulator disposed between the inner conductor and the outer conductor, the inner and outer conductors each having a first end electrically connectable to output terminals of the power source; and a compensation circuit having an adjustable impedance and having a first terminal that is electrically connected to a second end of the inner conductor of the coaxial line and to a first terminal of the load and having a second terminal that is electrically connected to a second end of the outer conductor of the coaxial line and to a second terminal of the load;

the compensation circuit being sufficiently adjustable to attain, for a pulse having a rise time or a fall time associated with a further range of frequencies that is faster than those associated with the predetermined range of frequencies, a combined impedance of the compensation circuit and the load that is substantially equal to the characteristic impedance of the coaxial line.

2. An apparatus according to claim 1, wherein the power source is a class D audio amplifier that outputs audio signals, the predetermined range is a range of frequencies from 20 Hz to 20 kHz, and the load is a speaker.

3. An apparatus according to claim 2, wherein the outputted audio signals are formed by low-pass filtering a modulated signal comprised of a train of pulses having corresponding pulse widths, each one of the pulse widths of the modulated signal being based on an amplitude and a frequency of an input audio signal associated with its corresponding pulse.

4. An apparatus according to claim 3, wherein each one of the train of pulses of the modulated signal has the rise time or the fall time that is associated with the further range of frequencies and is formed by comparing a switching signal and the input signal associated with that pulse.

5. An apparatus according to claim 4, wherein the compensation circuit is sufficiently adjustable to attain, at the switching signal frequency or at the further range of frequencies, the combined impedance of the compensation circuit and the load that is substantially equal to the characteristic impedance of the coaxial line.

6. An apparatus according to claim 5, wherein a frequency of the switching signal is at least tenfold greater than a maximum one of the predetermined range of frequencies of the output audio signals.

7. An apparatus according to claim 6, wherein the further range of frequencies is at least forty-fold greater than the frequency of the switching signal.

8. An apparatus according to claim 5, wherein the coaxial line includes a flexible core and an outer sheath, the inner conductor is a first braided conductor that is disposed around the flexible core, the insulator is disposed around the first braided conductor, the outer conductor is a second braided conductor that is disposed around the insulator, and the outer sheath is disposed around the second braided conductor.

9. An apparatus according to claim 8, wherein one or more of the first braided conductor and the second braided conductor is formed of oxygen free copper.

10. An apparatus according to claim 8, wherein the outer sheath is formed a low friction coefficient material.

11. An apparatus according to claim 5, wherein one or more of the first and second ends of the coaxial line includes a compression ferrule connection.

12. An apparatus according to claim 5, wherein the predetermined characteristic impedance of the coaxial line is defined by the relation:

$$Z_0 = \frac{377}{2\pi\sqrt{\varepsilon_{eff}}}\ln\left(\frac{D}{d}\right),$$

where $Z_0$ is the characteristic impedance of the coaxial line, D is the outer diameter of the insulator, d is the inner diameter of the insulator, and $\in_{eff}$ is the effective dielectric constant of the insulator.

13. An apparatus according to claim 5, wherein the compensation circuit includes a capacitance connected in series with a variable resistance.

14. An apparatus according to claim 13, wherein the variable resistance includes a plurality of discrete resistances that are selectable using an octal switch.

15. An apparatus according to claim 1, further comprising a test device electrically connected to the first end of the coaxial line in place of the power source, the test device having an input/output terminal that is electrically connected to one of the inner and outer conductors of the coaxial line and having a ground terminal that is electrically connected to another of the inner and outer conductors of the coaxial line, the test device being operable to output a signal along the one of the inner and outer conductors and to detect whether at least a part of the signal is reflected back to the test device along the one of the inner and outer conductors, the absence of the reflected signal indicating that the combined impedance of the compensation circuit and the load is substantially equal to the characteristic impedance of the coaxial line.

16. An apparatus according to claim 15, wherein the test device is operable to determine whether the second end of the one of the inner and outer conductors has an open termination or is shorted.

17. An apparatus according to claim 15, wherein the test device includes an indicator circuit operable to indicate whether the combined impedance of the compensation circuit and the load is substantially equal to the characteristic impedance of the coaxial line.

18. An apparatus according to claim 15, wherein the indicator circuit includes a light emitting diode (LED) display or a bar graph display operable to indicate whether or not the combined impedance of the compensation circuit and the load is substantially equal to the characteristic impedance of the coaxial line is attained.

19. An apparatus according to claim 15, wherein the power source is a class D audio amplifier that outputs audio signals, the predetermined range being a range of frequencies from 20 Hz to 20 kHz, and the load is a speaker.

20. An apparatus according to claim 19, wherein the outputted audio signals are formed by low-pass filtering a modulated signal comprised of a train of pulses having corresponding pulse widths, each one of the pulse widths of the modulated signal being based on an amplitude and frequency of an input audio signal associated with its corresponding pulse.

21. An apparatus according to claim 20, wherein each one of the train of pulses of the modulated signal has a rise time or a fall time that is associated with the further range of frequencies and is formed by comparing a switching signal and the input signal associated with that pulse.

22. An apparatus according to claim 21, wherein the compensation circuit is sufficiently adjustable to attain, at the switching signal frequency or at the further range of frequencies, the combined impedance of the compensation circuit and the load that is substantially equal to the characteristic impedance of the coaxial line.

23. An apparatus according to claim 22, wherein a frequency of the switching signal is at least tenfold greater than a maximum one of the predetermined range of frequencies of the output audio signals.

24. An apparatus according to claim 23, wherein the further range of frequencies is at least forty-fold greater than the frequency of the switching signal.

25. An audio system, comprising:

a power source that includes a class D audio amplifier that outputs audio signals within a range of frequencies from 20 Hz to 20 kHz;

a load that includes a speaker; and an apparatus for providing an impedance matched connection between the power source and the load according to claim 1.

26. An audio system according to claim 25, wherein the outputted audio signals are formed by low-pass filtering a modulated signal comprised of a train of pulses having corresponding pulse widths, each one of the pulse widths being based on an amplitude and frequency of an input signal associated with its corresponding pulse.

27. An audio system according to claim 26, wherein each one of the train of pulses has a rise time or a fall time that is faster than those associated with a further range of frequencies and is formed by comparing a switching signal and the input signal associated with that pulse.

28. An audio system according to claim 27, wherein the compensation circuit is sufficiently adjustable to attain, at the switching signal frequency or at the further range of frequencies, the combined impedance of the compensation circuit and the load that is substantially equal to the characteristic impedance of the coaxial line.

29. An audio system according to claim 28, wherein a frequency of the switching signal is at least tenfold greater than a maximum one of the range of frequencies of the output audio signals.

30. An audio system according to claim 29, wherein the further range of frequencies is at least forty-fold greater than the frequency of the switching signal.

31. An audio system, comprising:

a class D audio amplifier operable to output audio signals are within a range of frequencies from 20 Hz to 20 kHz, the output audio signals being formed by low-pass filtering a modulated signal comprised of a train of pulses having corresponding pulse widths, each one of the pulse widths being based on an amplitude and frequency of an input signal associated with its corresponding pulse, each one of the train of pulses having a rise time or a fall time that is faster than those associated with a further range of frequencies and being formed by comparing a switching signal and the input signal associated with that pulse, a frequency of the switching signal being at least tenfold greater than a maximum one of the range of frequencies of the output audio signals, the further range of frequencies being at least forty-fold greater than the frequency of the switching signal;

a load having an impedance of about 8Ω; and an apparatus for providing an impedance matched connection between the class D audio amplifier and the load, the apparatus comprising:

a coaxial line having a predetermined characteristic impedance and including an inner conductor disposed about an axis of the coaxial line, an outer conductor disposed about the inner conductor, and an insulator disposed between the inner conductor and the outer conductor, the inner and outer conductors each having a first end electrically connectable to output terminals of the power source; and a compensation circuit having an adjustable impedance and having a first terminal that is electrically connected to a second end of the inner conductor of the coaxial line and to a first terminal of the load and having a second terminal that is electrically connected to a second end of the outer conductor of the coaxial line and to a second terminal of the load, the compensation circuit being sufficiently adjustable to attain, at the switching signal frequency or at the further range of frequencies, a combined impedance of the compensation circuit and the load that is substantially equal to the characteristic impedance of the coaxial line.

* * * * *